United States Patent
Fukuda et al.

(10) Patent No.: US 7,538,352 B2
(45) Date of Patent: *May 26, 2009

(54) SEMICONDUCTOR DEVICE AND POWER CONVERTER, DRIVING INVERTER, GENERAL-PURPOSE INVERTER AND HIGH-POWER HIGH-FREQUENCY COMMUNICATION DEVICE USING SAME

(75) Inventors: Kenji Fukuda, Tsukuba (JP); Ryoji Kosugi, Tsukuba (JP); Junji Senzaki, Tsukuba (JP); Shinsuke Harada, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 272 days.

This patent is subject to a terminal disclaimer.

(21) Appl. No.: 10/536,192

(22) PCT Filed: Nov. 25, 2003

(86) PCT No.: PCT/JP03/14982

§ 371 (c)(1),
(2), (4) Date: Dec. 16, 2005

(87) PCT Pub. No.: WO2004/049449

PCT Pub. Date: Jun. 10, 2004

(65) Prior Publication Data

US 2006/0151806 A1    Jul. 13, 2006

(30) Foreign Application Priority Data

Nov. 25, 2002    (JP) .............................. 2002-340911

(51) Int. Cl.
*H01L 31/0312* (2006.01)
(52) U.S. Cl. ............................ 257/77; 257/76; 257/288; 257/E29.084; 257/E29.104
(58) Field of Classification Search .................. 257/288, 257/473, 76, 77; 438/198
See application file for complete search history.

(56) References Cited

U.S. PATENT DOCUMENTS 5,763,904 A * 6/1998 Nakajima et al. .............. 257/66

(Continued)

FOREIGN PATENT DOCUMENTS

| EP | 1 215 730 B1 | 6/2002 |
|---|---|---|
| JP | 2000-133819 | 5/2000 |
| JP | 2001-053293 | 2/2001 |
| WO | WO 01/18872 A1 | 3/2001 |

OTHER PUBLICATIONS

Kenji Fukuda et al., "A manufacturing process technique and application of a SiC power semi-conductor", National Institute of Advanced Industrial Science and Technology, pp. 25 to 32, Jan. 1, 2002.

(Continued)

*Primary Examiner*—Thao X Le
*Assistant Examiner*—Robert Huber
(74) *Attorney, Agent, or Firm*—Oblon, Spivak, McClelland, Maier & Neustadt, P.C.

(57) ABSTRACT

In a semiconductor device that uses a silicon carbide semiconductor substrate having p type, n type impurity semiconductor regions formed by ion implantation, the electrical characteristics of the end semiconductor device can be improved by decreasing the roughness of the silicon carbide semiconductor substrate surface. The semiconductor device of this invention is a Schottky barrier diode or a p-n type diode comprising at least one of a p type semiconductor region and n type semiconductor region selectively formed in a silicon carbide semiconductor region having an outermost surface layer surface that is a (000-1) surface or a surface inclined at an angle to the (000-1) surface, and a metal electrode formed on the outermost surface layer surface, that controls a direction in which electric current flows in a direction perpendicular to the outermost surface layer surface from application of a voltage to the metal electrode.

12 Claims, 5 Drawing Sheets

U.S. PATENT DOCUMENTS

| | | | | |
|---|---|---|---|---|
| 6,165,822 | A | * | 12/2000 | Okuno et al. ............... 438/142 |
| 2002/0047125 | A1 | * | 4/2002 | Fukuda et al. ............... 257/77 |
| 2003/0073270 | A1 | * | 4/2003 | Hisada et al. ............... 438/197 |
| 2006/0151806 | A1 | | 7/2006 | Fukuda et al. |

OTHER PUBLICATIONS

Formation of Low Resistance Layer for n+ Type Implanted 4H-SiC using Ultra High Temperature Rapid Thermal Annealing Process, -Achievement of World Record in Sheet Resistance for Implanted SiC Layer-, ETL News, vol. 613, pp. 2 to 7, Feb. 2001.

K. Fukuda et al., 'Effect of oxidation method and post-oxidation annealing on interface properties of metal-oxide-semiconductor structures formed on n-type 4H-SiC C(0001) face', Applied Physics Letters, vol. 77, No. 6, pp. 866 to 868, Aug. 7, 2000.

M. K. Das, 'Currects Issues and Future Prospects of SiC MOS Devices', FED Journal, vol. 11, No. 2, pp. 67 to 72, 2000.

James A. Cooper, Jr. et al., "Status and prospects for SiC power MOSFETs", IEEE Transactions on Electron Devices, vol. 49, No. 4, pp. 658 to 664, Apr. 2002.

Sei-Hyung Ryu et al., "10 A, 2.4 kV Power DiMOSFETs in 4H-SiC", IEEE Electron Device Letters, vol. 23, No. 6, pp. 321 to 323, Jun. 2002.

J. Spitz et al., "2.6 kV 4-H-SiC Lateral DMOSFET's", IEEE Electron Device Letters, vol. 19, No. 4, pp. 100-102, Apr. 1998.

Shinji Ogino: "Channel Doped SiC-MOSFETs", Materials Science Forum, vols. 338-342, pp. 1101-1104, 2000.

U.S. Appl. No. 11/718,036, filed Apr. 26, 2007, Yatsuo et al.

* cited by examiner

Effect of heat treatment time on surface roughness (RMS) of (0001) face and (000-1) surface

|  | 1 minute | 10 minutes |
|---|---|---|
| (0001) face | 0.7 nm | 1.5 nm |
| (000-1) surface | 0.4 nm | 0.6 nm |

F I G. 7
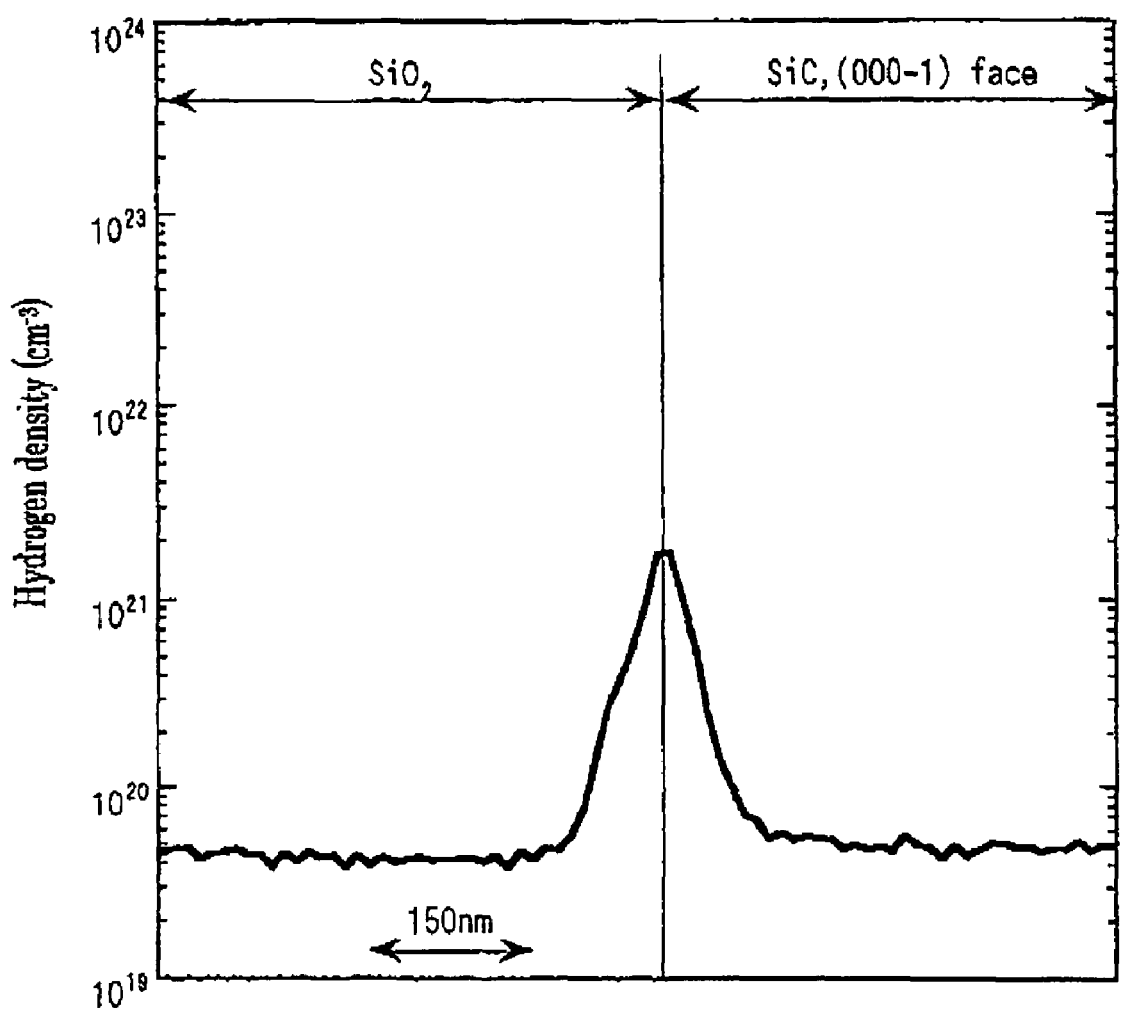

US 7,538,352 B2

SEMICONDUCTOR DEVICE AND POWER CONVERTER, DRIVING INVERTER, GENERAL-PURPOSE INVERTER AND HIGH-POWER HIGH-FREQUENCY COMMUNICATION DEVICE USING SAME

TECHNICAL FIELD

This invention relates to a semiconductor device formed on a silicon carbide substrate having a prescribed substrate crystalline surface orientation, and to an electric power converter, drive inverter, general-purpose inverter and super-power high-frequency communication equipment using the semiconductor device.

BACKGROUND ART

With respect to a semiconductor device using silicon carbide on the uppermost layer of a semiconductor substrate and to a method of manufacturing the same, as described in the following, there have been a number of publications and disclosures of inventions, but in the prior art, a semiconductor device using a silicon carbide substrate has a structure in which a gate electrode is normally formed on the (0001) face. In this case, when forming a p type or n type region by ion implantation in the (0001) face, ion implantation of a p type or n type impurity is followed by heat treatment at a high temperature of 1500° C. or above for activation, so silicon evaporates from the silicon carbide surface, leading to increased roughness of the silicon carbide surface. This results in reduced channel mobility of metal-insulation film-semiconductor field-effect transistors (MISFETs) or metal-semiconductor field-effect transistors (MESFETs), and increased leak current in Schottky barrier diodes (SBDs) and junction type field-effect transistors (JFETs) caused by larger crystal defects in the ion implantation region, problems which make practical use impossible.

For example, Non-Patent Document 1 describes the occurrence of step punching due to high-temperature heat treatment for impurity activation, producing increased surface roughness, so that in order to reduce the On-resistance value of a 4H—SiC power MOSFET to the theoretical value, the channel mobility was no more than 1 cm$^2$/Vs, even though 100 cm$^2$/Vs or more is needed.

[Non-Patent Document 1]: J. A. Cooper, Jr., M. R. Melloch, R. Singh, A. Agarwal, J. W. Palmour, IEEE Transaction on electron devices, vol. 49, No. 4, April 2002, p. 658

Also, Non-Patent Document 2 describes a DiMOSFET type SiC power MOSFET in which channel mobility at room temperature was only 22 cm$^2$/Vs, due to the use of heat treatment in the region of 1600° C. following ion implantation of a p type impurity (aluminum).

[Non-Patent Document 2]: S. H. Ryu, A. Agarwal, J. Richmond, J. Palmour, N. Saks and J. Williams, IEEE Electron device letters, vol. 23, No. 6, Jun. 2002, p. 321

Also, Non-Patent Document 3 describes a lateral DMOSFET type SiC power MOSFET in which channel mobility was only 4 to 5 cm$^2$/Vs, due to the use of activation heat treatment at 1600° C. for 40 minutes following ion implantation of a p type impurity (aluminum).

[Non-Patent Document 3]: J. Spitz, M. R. Melloch, J. A. Cooper, Jr., M. A Capano, IEEE Electron device letters, vol. 19, No. 4, April 1998, p. 100

DISCLOSURE OF THE INVENTION

Thus, in each of the above prior-art references, a semiconductor device having a p type or n type region formed on a silicon carbide substrate by impurity ion implantation, is formed on the (0001) face. However, a silicon carbide substrate has various surface orientations, and by contriving the surface orientation and the impurity heat treatment method in that surface orientation, it is possible to suppress the roughness on the silicon carbide substrate surface following the impurity activation heat treatment, improving the electrical characteristics of the semiconductor device.

Non-Patent Document 4 reports the operation of a MOSFET formed using channel doping by implanting an impurity below the gate oxide film on a 6H—SiC (000-1) surface, but only an n type semiconductor region was formed by ion implantation, the gate oxide film being formed by dry oxidation, so the structure differs from that of the semiconductor device described below in the, examples.

[Non-Patent Document 4]: S. Ogino, T. Oikawa, K. Ueno, Mat. Sci. Forum, 338-342 (2000), p. 1101

This invention is proposed in view of the above, and has as its object, in a semiconductor device that uses a silicon carbide substrate having p type, n type semiconductor impurity regions formed by ion implantation, to improve the ultimate electrical characteristics of the semiconductor device by reducing surface roughness of the silicon carbide substrate.

In accordance with this invention, the above object is attained by a semiconductor device characterized in that at least an outermost surface layer has a semiconductor region constituted by (000-1) surface silicon carbide, and at least one of a p type semiconductor region and an n type semiconductor region is selectively formed in the silicon carbide semiconductor region by ion implantation.

BRIEF DESCRIPTION OF THE DRAWINGS

FIG. 7 is a diagram showing the hydrogen density distribution in a gate insulation film, measured using a SIMS (secondary ion mass spectrometer).

BEST MODE FOR CARRYING OUT THE INVENTION

A method of manufacturing a Schottky barrier diode, a lateral type MIS field-effect transistor and a vertical type MIS field-effect transistor that are examples of a semiconductor device formed using the (000-1) surface of a silicon carbide substrate will be described. This will be followed by showing the results of measurements, by an atomic force microscope, of the surface roughness of substrates that have been heat-treated following ion implantation in the (0001) face used in a semiconductor device that uses a normal silicon carbide semiconductor substrate and in the (000-1) surface proposed by the present invention.

Figure 1:
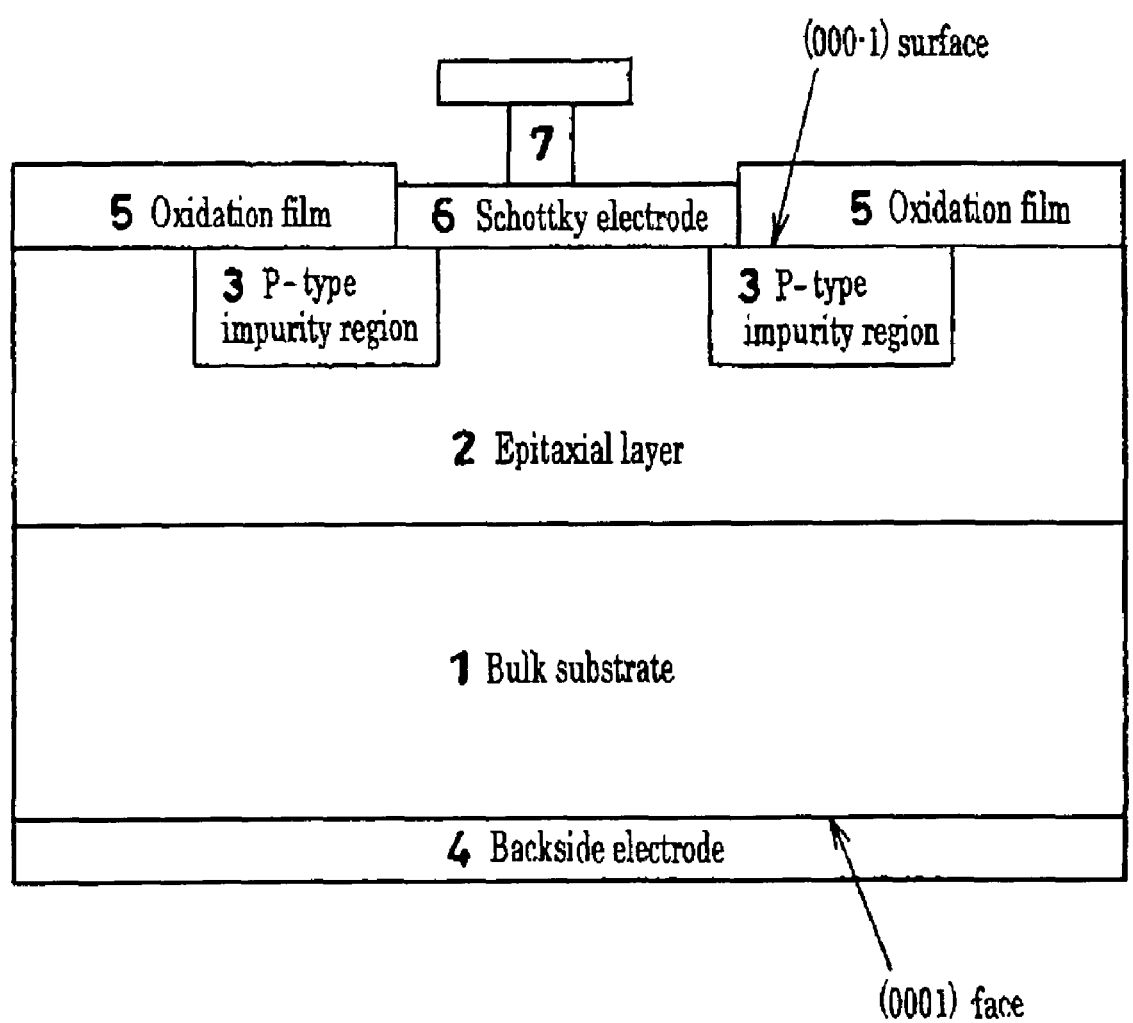
FIG. 1 is a cross-sectional schematic diagram of a Schottky barrier diode that is an example of the semiconductor device of the present invention.

FIG. 1 is a cross-sectional schematic diagram of a Schottky barrier diode that is an example of the semiconductor device of the present invention.

This Schottky barrier diode was manufactured by the following procedure. First, the chemical vapor method was used to grow a 10 μm n type epitaxial layer 2 having a nitrogen impurity concentration of $1 \times 10^{16}$ cm$^{-3}$ on the (000-1) surface of an n type 4H—SiC bulk substrate 1 (resistivity: 0.002 Ωcm, thickness: 300 μm). The bulk substrate 1 and epitaxial layer 2 form a silicon carbide semiconductor region, and the outermost surface layer of the epitaxial layer 2 has a (000-1) surface.

In order to form a guard ring around a Schottky electrode 6, $1 \times 10^{17}$ ions per cm$^3$ of a p type impurity constituted by aluminum or boron were implanted into the region forming the guard ring of the epitaxial layer 2, forming the guard ring p type impurity region (p type semiconductor region) 3. A silicon dioxide film formed by the low-pressure chemical vapor method was used as the mask for this ion implantation. After using hydrofluoric acid to form the openings for the ion implantation in the silicon dioxide film, ion implantation is carried out at a temperature ranging from room temperature to 1000° C.; in this embodiment the ions were implanted at room temperature.

Next, the temperature is elevated from 1200° C. or below to from 1500° C. to 2000° C., preferably to 1700° C., within 1 minute, in an argon atmosphere, to carry out activation heat treatment for a period of from 10 seconds to 10 minutes. In this embodiment, heat treatment was carried out at 1500° C. for 5 minutes. Following this, the sputtering method or vapor deposition method is used to form an Ni layer or a Ti layer (backside electrode 4) on the backside (0001) face of the bulk substrate 1, after which heat treatment at around 1000° C. in an inert atmosphere is carried out, forming the backside electrode 4. Next, a passivation oxide film 5 is grown on the ion-implanted side of the epitaxial layer 2, portions are opened for forming the Schottky electrode, and the sputtering or vapor deposition method is used to form an Ni or Ti Schottky electrode (metal electrode) 6. To complete the device, a metal wire 7 of aluminum alloy is formed by the sputtering or vapor deposition method. This semiconductor device has a gate (Schottky electrode) on the (000-1) surface of the silicon carbide semiconductor region and a drain (backside electrode) on the (0001) face, and by applying a voltage to the gate functioned as a rectifying device that controls the flow of current in the direction of the C axis perpendicular to the (000-1) plane.

In the manufacture of the Schottky barrier diode, the p type semiconductor region 3 is formed by ion implantation in the silicon carbide semiconductor regions 1 and 2 having (000-1) outermost surface layers, so surface roughness of the silicon carbide semiconductor substrate 1 and 2 can be reduced, thereby improving the On-resistance, blocking voltage and other such electrical characteristics of the Schottky barrier diode.

Also, impurity activation heat treatment is implemented after the p type semiconductor region 3 is formed by ion implantation, enabling further improvement of the roughness of the outermost surface layers of the silicon carbide semiconductor regions 1 and 2, thereby enabling a corresponding further improvement in the electrical characteristics of the Schottky barrier diode.

Although the above explanation was made with reference to the present invention applied to a Schottky barrier diode that controls the flow of current in the direction of the C axis perpendicular to the (000-1) plane, it may also be applied to a p-n type diode that similarly controls the flow of current in the direction of the C axis perpendicular to the (000-1) plane.

Figure 2:
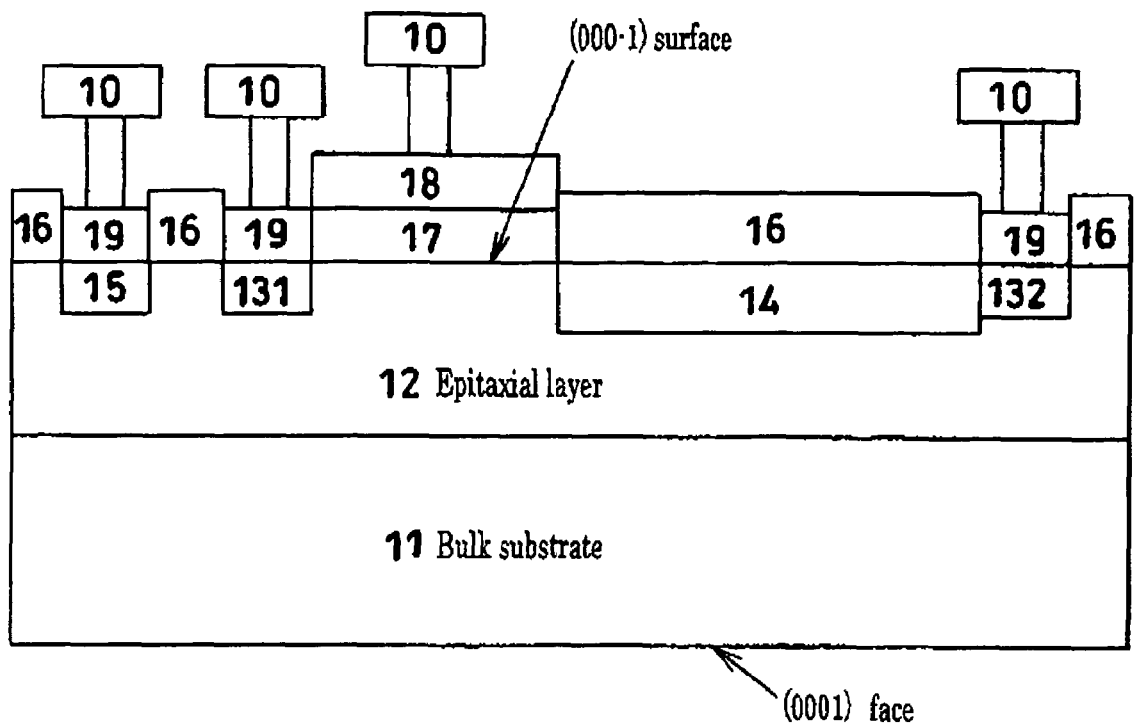
FIG. 2 is a cross-sectional schematic diagram of a semiconductor device having a lateral type structure (lateral resurf MOS structure) that is an example of a lateral MIS field-effect transistor according to the present invention.

FIG. 2 is a cross-sectional schematic diagram of a semiconductor device having a lateral type structure (lateral resurf MOS structure) that is an example of a lateral MIS field-effect transistor according to the present invention. First, the chemical vapor method was used to grow a 10~15 μm p type epitaxial layer 12, with aluminum as the impurity, on the (000-1) surface of a p type 4H—SiC bulk substrate 11 (resistivity: 2 Ωcm, thickness: 300 μm). The p type impurity concentration was $5 \times 10^{15}$ cm$^{-3}$. The SiC bulk substrate 11 may be n type. The bulk substrate 11 and epitaxial layer 12 form a silicon carbide semiconductor region, and the outermost surface layer of the epitaxial layer 12 has a (000-1) surface.

Next, in order to form a source region and a drain region, an ion implantation mask is formed using a thermal oxidation film or an SiO$_2$ film formed by CVD (Chemical Vapor Deposition). In this embodiment, an LTO (Low Temperature Oxide) film is used for the ion implantation mask. The LTO film is formed by reacting silane and oxygen at from 400° C., to 800° C. to deposit silicon dioxide.

Following this, photolithography is used to form the source region and the drain region, after which HF (hydrofluoric acid) is used to etch openings in the LTO film for the source region and drain region into which ions are implanted, and the openings are used to implant ions of nitrogen, phosphorus or arsenic at 500° C., forming n type impurity regions used to constitute a source 131 and a drain 132.

Then, the same method as in the case of the source 131 and drain 132 is used to perform ion implantation, thereby forming an n$^-$ impurity region 14 for high blocking voltage. This region can be divided into two or more regions in which the concentration increases going from the gate towards the drain. As in the case of the source 131, the drain 132 and the n impurity region 14, to establish ohmic contact with the p type epitaxial layer 12, an ion implantation mask is formed and aluminum or boron ions are implanted to form a p$^+$ impurity region 15. Here the "−" of n$^-$ indicates a lower concentration than the n type impurity concentration of the n type region, and the "+" of p$^+$ indicates a higher concentration than the p type impurity concentration of the p type region.

Next comes impurity activation heat treatment for a period of from 10 seconds to 10 minutes in an argon atmosphere at a temperature range of from 1500° C. to 2000° C., followed by cooling to or below a temperature of 1200° C. for 1 to 5 minutes. In this embodiment, heat treatment was carried out at 1500° C. for 5 minutes. It is more preferable for the temperature to be elevated from 1200° C. or below to the heat treatment temperature within 1 minute.

Following this, a passivation SiO$_2$ film 16 is formed on the epitaxial layer 12 as a thermal oxidation film or LTO film. In this embodiment, it is formed as an LTO film. An opening is made for the gate insulation film portion, and a gate insulation film 17 that is approximately 50 nm is formed by oxidation at 800° C.~1200° C. using O$_2$ gas or O$_2$ gas containing H$_2$O (water), All of the gate insulation film 17 or at least the layer in contact with the epitaxial layer 12 is formed by thermal oxidation of silicon carbide. When thermal oxidation in an O$_2$ atmosphere containing water is used, the gate insulation film that is formed contains hydrogen. A gate electrode (Metal electrode) 18 is formed on the gate insulation film 17. The gate electrode 18 can be formed using aluminum or n type or p type polysilicon. The gate insulation film 17 and the gate electrode 18 are called gates. Next, contact holes are etched in the SiO$_2$ film 16 on the source 131 and drain 132. Then, after using vapor deposition or the sputtering method to form a metal containing nickel, titanium or aluminum, or a layered film of these, RIE or wet etching is used to form a contact electrode (metal electrode) 19 which is ohmic-contacted using heat treatment at about 1000° C. in an inert atmosphere. To complete the device, a metal containing aluminum is formed by vapor deposition or the sputtering method, which is followed by the forming of a metal wire 10, using RIE or wet etching.

Figure 3:
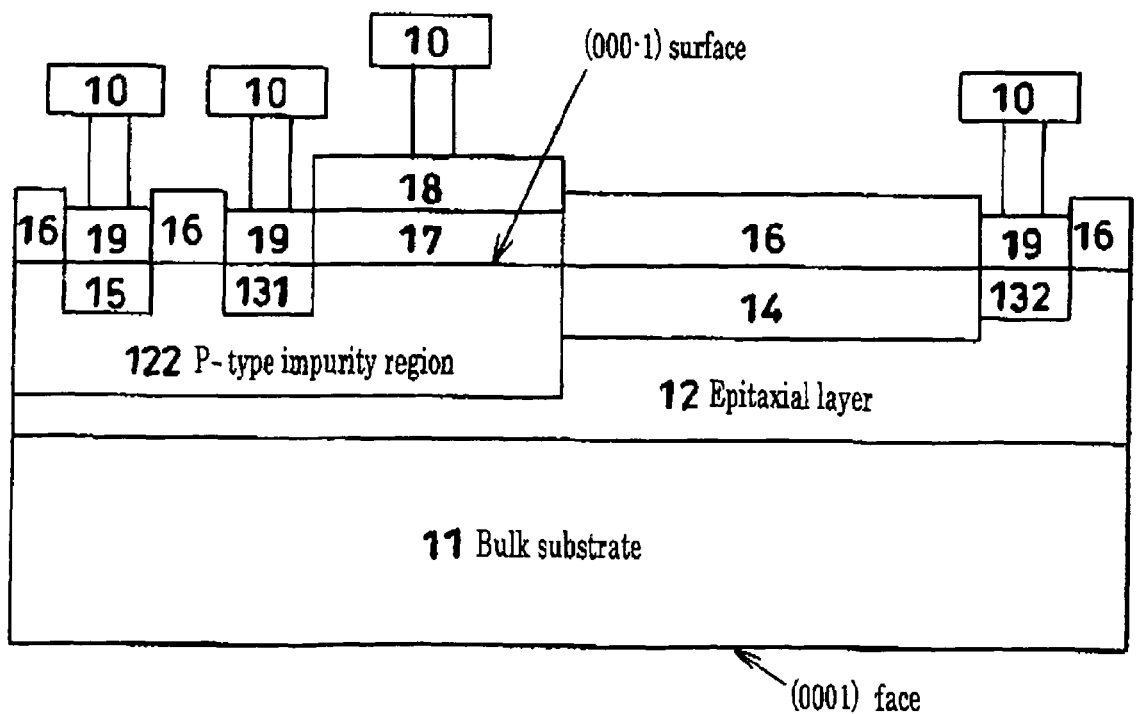
FIG. 3 is a cross-sectional schematic diagram of a semiconductor device having a lateral type structure (lateral resurf MOS structure) that differs from the structure of FIG. 2, which is an example of a lateral type MIS field-effect transistor according to the present invention.

FIG. 3 is a cross-sectional schematic diagram of a lateral type semiconductor device having a lateral resurf MOS structure that differs from the structure of FIG. 2, which is an example of a lateral MIS field-effect transistor according to the present invention. While basically the same as in FIG. 2, it differs from that of FIG. 2 in that the epitaxial layer 12 is provided with a p type impurity region 122, and the above source 131 and p$^+$ impurity region 15 are formed in the p type impurity region 122.

The lateral resurf MOSFET semiconductor devices shown in FIGS. 2 and 3 have a gate (comprised of a gate insulation film and gate electrode), source and drain on the (000-1) surface of the silicon carbide semiconductor region, and when a voltage is applied to the gate, they are switching devices that control the flow/interception of electric current flowing in the (000-1) plane.

A MES type field-effect transistor is another example of a lateral resurf semiconductor: device. This is the same as a lateral resurf MOSFET semiconductor device in that it has a gate, source and drain on the (000-1) surface and when a voltage is applied to the gate, it controls the flow/interception of electric current flowing in the (000-1) plane. However, it does not have a gate insulation film below the gate electrode, but instead has a gate electrode of metal that is formed directly on the silicon carbide semiconductor.

In the manufacture of the lateral type semiconductor device, the source 131, drain 132, n$^-$ impurity region 14, p$^+$ impurity region 15 and other such p type and n type semiconductor regions are formed by ion implantation in the silicon carbide semiconductor regions 11 and 12 having (000-1) outermost surface layers, so surface roughness of the silicon carbide semiconductor substrate 11 and 12 can be reduced compared with the (0001) face, thereby improving the On-resistance, blocking voltage and other such electrical characteristics of the lateral type semiconductor device.

After forming the p type and n type semiconductor regions, such as the source 131, drain 132, n$^-$ impurity region 14, p$^+$ impurity region 15 and so forth, by ion implantation, the temperature is elevated from 1500° C. to 2000° C. in an inert atmosphere to carry out impurity activation heat treatment for a period of from 10 seconds to 10 minutes, and, moreover, the temperature is elevated from 1200° C. or below to from 1500° C. to 2000° C. in an inert atmosphere, within 1 minute, to carry out impurity activation heat treatment at that temperature for a period of from 10 seconds to 10 minutes, enabling further improvement of the roughness of the outermost surface layers of the silicon carbide semiconductor regions 11 and 12, thereby enabling a corresponding further improvement in the electrical characteristics of the lateral type semiconductor device.

Figures 4, 5:
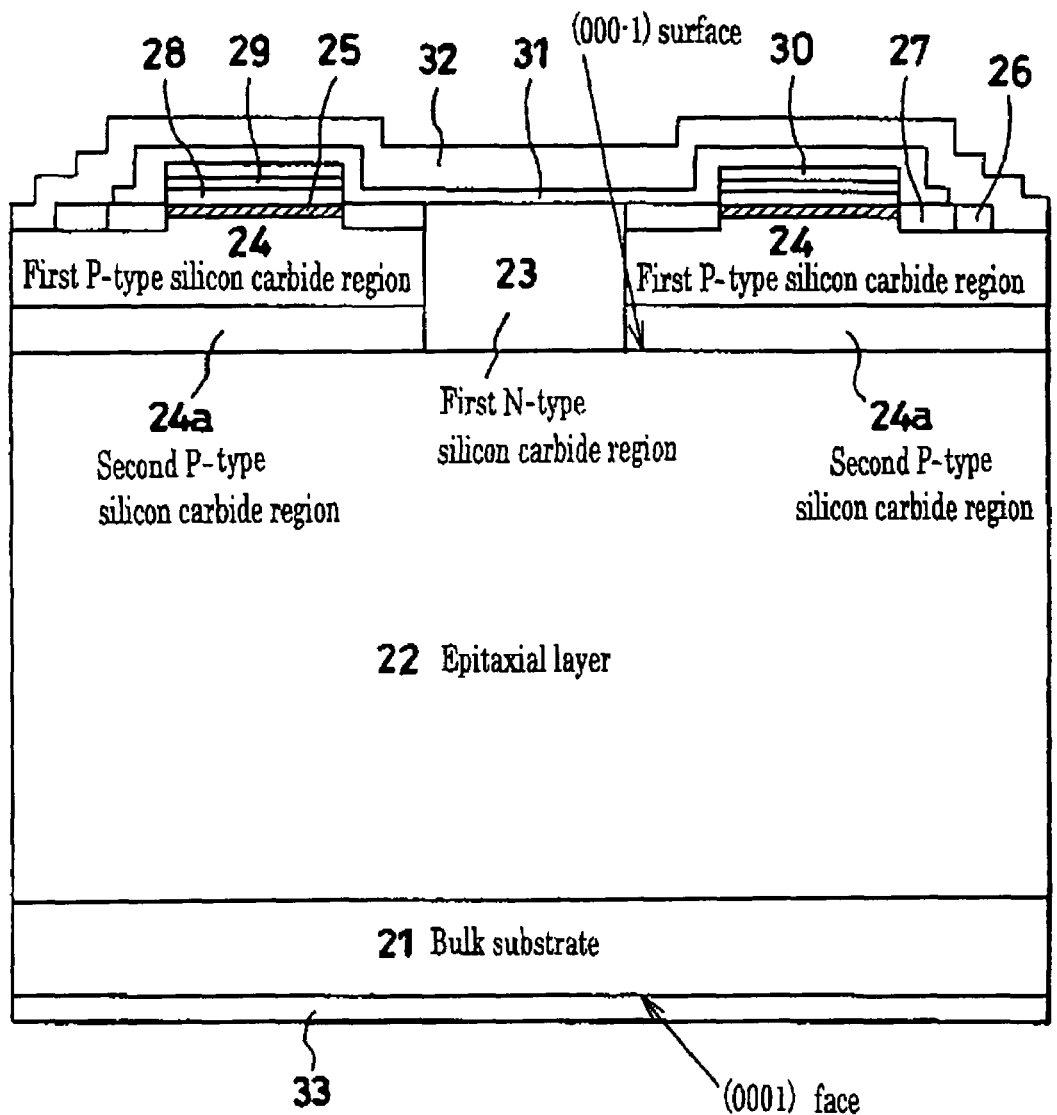
FIG. 4 is a cross-sectional schematic diagram of a vertical type MIS field-effect transistor that is an example of the semiconductor device of the present invention.
FIG. 5 is a diagram that shows the measured results of surface roughness) (RMS) versus length of heat treatment of the (0001) face and (000-1) surface of silicon carbide substrates.

FIG. 4 is a cross-sectional schematic diagram of a vertical type MIS field-effect transistor that is an example of the semiconductor device of the present invention. In the semiconductor device of this invention, a bulk substrate 21 is constituted as a high concentration n type 4H—SiC substrate on the (000-1) surface of which an epitaxial layer 22 of low concentration n type silicon carbide is formed. The bulk substrate 21 and epitaxial layer 22 form a silicon carbide semiconductor region, and the outermost surface layer of the epitaxial layer 22 has a (000-1) surface.

Next, a first n type impurity region 23 constituted by silicon carbide having a first concentration is grown epitaxially on the epitaxial layer 22 by the chemical vapor method. Then, after the silicon carbide substrate has been cleaned using standard RCA cleaning, RIE (reactive ion etching) is used to form lithography alignment marks.

Then, a LTO (low temperature oxide) film is used for an ion implantation mask. The LTO film is formed by reacting silane and oxygen at from 400° C. to 800° C. to deposit silicon dioxide on the silicon carbide substrate (first n type impurity region 23). Next, after forming the region by ion implantation, using lithography, HF (hydrofluoric acid) is used to open the LTO film by etching. Then, first p type silicon carbide regions (p type (p$^-$) wells) 24, 24 are formed adjoining both sides of the first n type impurity region 23 by implanting aluminum or boron ions into the first n type impurity region 23.

In addition, for high blocking voltage, ion implantation is used to form, in the lower region of the first p type silicon carbide region 24, a second p type silicon carbide region (p$^+$ region) 24a having a higher concentration than the first p type silicon carbide region 24. The second p type silicon carbide region 24a is formed by the implantation of $10^{18}$ to $10^{19}$ ions of aluminum or boron per cm$^{-3}$, ensuring improved blocking voltage.

If required, a buried channel region 25 constituting an n type impurity region having a sufficient impurity concentration can be selectively formed inwards from the surface of the first p type silicon carbide region 24, below the region where the gate oxide film is going to be formed. This buried channel region 25 is formed at a depth (Lbc)=0.3 μm by the implantation of $1 \times 10^{15} \sim 5 \times 10^{17}$ ions per cm$^3$, Multiple implantation steps were used to achieve a total phosphorus dosage amount of $7 \times 10^{15}$ cm$^{-2}$, and the implantation energy was controlled within the range 40 keV~250 keV to achieve formation having the desired depth.

Next, at a location away from the first n type impurity region 23, second n type impurity regions (n$^+$ sources) 26, 26 are selectively formed inwards from the surface of the first p type silicon carbide regions 24, 24.

Also if necessary, using ion implantation, a third n type impurity region 27 having a third concentration can be selectively formed inwards from the surface of the first p type silicon carbide region 24, between the second n type impurity region 26 and the buried channel region 25.

Next comes impurity activation heat treatment for a period of from 10 seconds to 10 minutes in an argon atmosphere in a temperature range of from 1500° C. to 2000° C., followed by cooling to or below a temperature of 1200° C. for 1 to 5 minutes. In this embodiment, heat treatment was carried out at 1500° C. for 5 minutes. It is more preferable for the temperature to be elevated from 1200° C. or below to the heat treatment temperature within 1 minute.

This is followed by oxidation at 1200° C. in an O$_2$ atmosphere of or O$_2$ atmosphere containing H$_2$O to form approximately 50 nm gate oxide films 28, 28. All of the gate insulation film 28 or at least the layer in contact with the epitaxial layer 22 is formed by thermal oxidation of silicon carbide.

When thermal oxidation in an $O_2$ atmosphere containing water is used, the gate insulation film that is formed contains hydrogen. FIG. 7 is a diagram showing the hydrogen density distribution in the gate insulation film, measured using a SIMS (secondary ion mass spectrometer). With the hydrogen distribution centering on the interface between the silicon carbide substrate (000-1) surface and the gate insulation film, if the hydrogen content is not less than $1 \times 10^{19}$ cm$^{-3}$ and not more than $1 \times 10^{22}$ cm$^{-3}$, interface defects are reduced, improving channel mobility. Next came 30 minutes of annealing in argon, followed by cooling to room temperature in the argon. Then, gate electrodes 29, 29 were formed. The gate electrodes 29, 29 were formed of p$^+$ polysilicon. Methods of forming the gate electrodes 29, 29 from pa polysilicon include; 1) after forming polycrystalline silicon by the CVD method, p type polycrystalline silicon is formed by ion implantation of boron or boron fluoride, 2) after forming polycrystalline silicon by the CVD method, a $SiO_2$ film containing boron is formed by the CVD method or by spin-coating and diffused by heat treatment at 800° C. to 1100° C. to implant the boron and form p type polycrystalline silicon, and 3) flowing silane and diborane together and heat treating at 600° C. to form polycrystalline silicon that is implanted with boron to form p type polycrystalline silicon. In this embodiment, method 2) was used. Then, etching is used to complete the forming of the gate electrodes 29, 29.

Although in the above description, the gate electrode 29 was formed of p$^+$ polysilicon, it may be formed of aluminum, aluminum alloy or molybdenum metal. When the gate electrode 29 is formed of aluminum, aluminum alloy or molybdenum metal, the interface with the gate oxide film 28 is better than the interface with the gate oxide film 28 when polysilicon is used for the gate electrode 29, and it was confirmed that it had the effect of raising the channel mobility.

A silicide film 30 of $WSi_2$, $MoSi_2$ or $TiSi_2$ may be formed on the above gate electrodes 29, 29.

After then using the CVD method to form an interlayer insulation film 31 by deposition, contact holes are etched in the interlayer insulation film 31 over the second n type impurity regions (n$^+$ sources) 26, 26 and the first p type silicon carbide regions (p$^-$ wells) 24, 24. Then, after using vapor deposition or the sputtering method to form a metal containing nickel, titanium or aluminum, or a layered film of an alloy of these, RIE or wet etching is used to form a metal wire 32 of polycrystalline silicon, short-circuiting the first p type silicon carbide regions 24 and the second n type impurity regions 26. In this embodiment, the metal wire 32 is formed by evaporation of aluminum followed by wet etching.

Next, drain electrode 33 is formed on the backside of the bulk substrate 21 by vapor deposition or sputtering a metal to the required thickness. In this embodiment, this was done by the sputtering of nickel. If necessary, heat treatment can be carried out in an argon atmosphere at 1000° C. for 5 minutes, thereby completing the vertical type AUS field-effect transistor.

With respect to vertical type semiconductor devices, there is also a junction type field-effect transistor. This has a structure in which there is no oxide film below the gate electrode; instead, the metal gate electrode is formed directly on the silicon carbide. The flow/interception of electric current flowing in a direction perpendicular to the (000-1) plane is controlled by applying a voltage to the gate electrode.

In the manufacture of the vertical type MIS field-effect transistor and junction type field-effect transistor, first n type silicon carbide region 23, first p type silicon carbide region 24, second p type silicon carbide region 24a and other such p type and n type semiconductor regions are formed by ion implantation in the silicon carbide semiconductor substrates (silicon carbide semiconductor regions) 21 and 22 having (000-1) outermost surface layers, so surface roughness can be reduced compared with the (0001) face of the silicon carbide semiconductor substrates 21 and 22, thereby improving the On-resistance, blocking voltage and other such electrical characteristics of the vertical type MIS field-effect transistor and junction type field-effect transistor.

After forming the first n type silicon carbide region 23, first p type silicon carbide region 24, second p type silicon carbide region 24a and other such p type and n type semiconductor regions by ion implantation, impurity activation heat treatment is carried out, enabling further improvement of the roughness of the outermost surface layers of the silicon carbide semiconductor regions 21 and 22, thereby enabling a corresponding further improvement in the electrical characteristics of the vertical type MIS field-effect transistor and junction type field-effect transistor.

Figure 6:
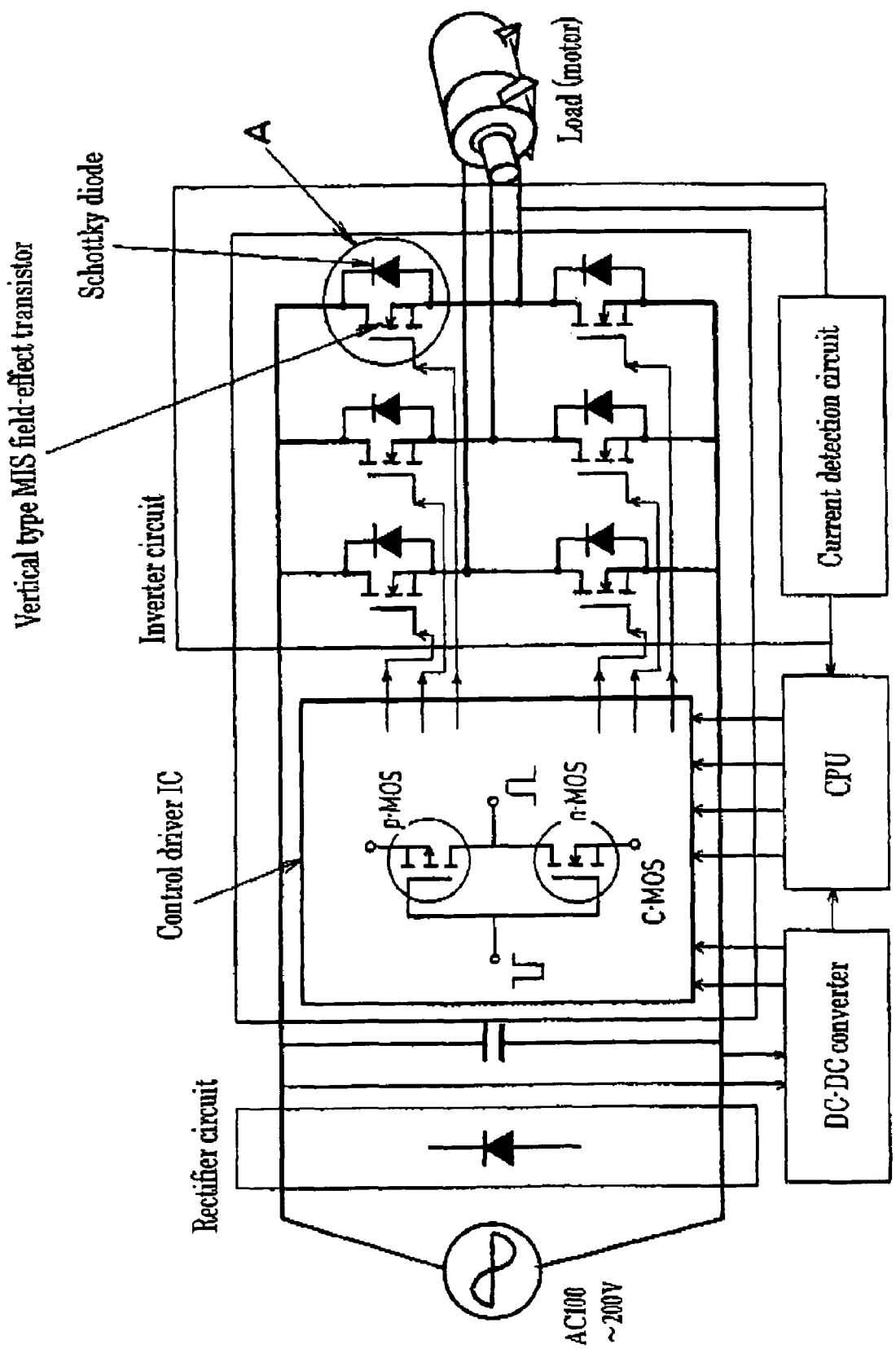
FIG. 6 is a circuit diagram of a motor drive power IC that uses the vertical type MIS field-effect transistor and Schottky barrier diode of the present invention.

By improving the electrical characteristics of the above-described semiconductor device according to the present invention, such as, for example, Schottky barrier diode, p-n type diode, junction type field-effect transistor, lateral type MIS field-effect transistor and vertical type MIS field-effect transistor, electric power converters, drive inverters, general-purpose inverters and MES type field-effect transistors can be incorporated as components of GHz-band super-power high-frequency communication equipment, thereby helping to improve the performance of such apparatuses. FIG. 6 is a circuit diagram of a motor drive power IC. The inverter portion (A) of this power IC circuit uses the vertical type MIS field-effect transistor and Schottky barrier diode of the present invention.

Moreover, although in the above description the outermost surface layer of the silicon carbide semiconductor region has a (000-1) surface and that surface is subjected to various treatments, the outermost surface layer surface may have a surface plane that is inclined at an angle to the (000-1) surface (for example, within 10 degrees, and preferably by about 3.5 degrees), and that surface may be subjected to various treatments.

Next, the effect of heat treatment time on the surface roughness (RMS) of the (0001) face and (000-1) surface of silicon carbide semiconductor substrates will be explained.

In order to examine the effect that activation heat treatment has on surface roughness, (0001) face silicon carbide semiconductor substrates and (000-1) surface silicon carbide semiconductor substrates were heated from room temperature to 1600° C. in 1 minute and subjected to activation heat treatment for 1 minute and 10 minutes, and an atomic force microscope was used to observe the surfaces and measure the surface roughness (RMS). The results are shown in FIG. 5. As can be seen from FIG. 5, whether at a heat treatment time of 1 minute or 10 minutes, the (000-1) surface had less surface roughness (RMS) than the (0001) face, about half as much.

Therefore, by forming a semiconductor device having ion implantation regions in the (000-1) surface, and forming a gate insulation film or gate electrode thereon and fabricating a lateral type MIS field-effect transistor, vertical type MIS field-effect transistor, MES type field-effect transistor, junction type field-effect transistors and other such semiconductor devices, when the device is on, there is less scattering of flowing electrons caused by silicon carbide substrate surface roughness, facilitating the flow of electrons and lowering the On-resistance. Also, the high frequency characteristics of MES type field-effect transistors are improved. Moreover, when forming the junction portions of lateral type MIS field-effect transistors, vertical type WIS field-effect transistors, UES type field-effect transistors, junction type field-effect transistors, Schottky barrier diodes and p-n type diodes, it is harder for crystal defects to form, so when a reverse (negative) voltage is applied to the gate electrode, leak current is reduced, while at the same time blocking voltage can be improved.

INDUSTRIAL APPLICABILITY

As described in the foregoing, the semiconductor device of this invention has a silicon carbide semiconductor region in which at least the outermost surface layer has a (000-1) surface, and in this silicon carbide semiconductor region, at least one selected from a p type semiconductor region and an n type semiconductor region is selectively formed by ion implantation, enabling roughness of the silicon carbide semiconductor region surface to be reduced, thereby making it possible to improve electrical characteristics of the semiconductor device, such as the On-resistance and the blocking voltage.

Also, after the p type semiconductor region or n type semiconductor region is formed by ion implantation, impurity activation heat treatment is implemented, thereby enabling further reduction in the roughness of the outermost surface layer of the silicon carbide semiconductor region, and a corresponding further improvement in the electrical characteristics of the semiconductor device.

The invention claimed is:

1. A semiconductor device comprising:
    at least one of a p type semiconductor region and n type semiconductor region selectively formed in a silicon carbide semiconductor region including a silicon carbide bulk substrate and an epitaxial SiC layer;
    an outermost surface layer surface of the epitaxial SiC layer having a (000-1) surface or a surface inclined at an angle to the (000-1) surface; and
    a gate insulation film formed on the (000-1) epitaxial SiC layer surface,
    wherein the gate insulation film contains hydrogen with not less than $1\times10^{19}$ cm$^{-3}$ and not more than $1\times10^{22}$ cm$^{-3}$ in density on an interface with the (000-1) epitaxial SiC layer surface.

2. A semiconductor device comprising:
    at least one of a p type semiconductor region and n type semiconductor region selectively formed in a silicon carbide semiconductor region including a silicon carbide bulk substrate and an epitaxial SiC layer;
    an outermost surface layer surface of the epitaxial SiC layer having a (000-1) surface or a surface inclined at an angle to the (000-1) surface; and
    a gate insulation film formed on the (000-1) epitaxial SiC layer surface,
    wherein the gate insulation film has a layer in contact with a silicon carbide substrate formed by thermal oxidation of silicon carbide in an atmosphere containing water and the formed gate insulation film contains hydrogen with not less than $1\times10^{19}$ cm$^{-3}$ and not more than $1\times10^{22}$ cm$^{-3}$ in density on an interface with the (000-1) epitaxial SiC layer surface.

3. A semiconductor device comprising:
    at least one of a p type semiconductor region and n type semiconductor region selectively formed in a silicon carbide semiconductor region including a silicon carbide bulk substrate and an epitaxial SiC layer;
    an outermost surface layer surface of the epitaxial SiC layer having a (000-1) surface or a surface inclined at an angle to the (000-1) surface and
    a gate insulation film formed on the (000-1) epitaxial SiC layer surface,
    wherein the gate insulation film contains nitrogen with not less than not less than $1\times10^{19}$ cm$^{-3}$ and not more than $1\times10^{22}$ cm$^{-3}$ in density as an impurity on an interface with the (000-1) epitaxial SiC layer surface.

4. The semiconductor device according to claim 1 or 3 that is a lateral MIS field-effect transistor having a gate insulation film, gate electrode, source and drain on the outermost surface layer surface of the silicon carbide semiconductor region that, when a voltage is applied to the gate electrode, functions as a switching device that controls electric current flow/interception in the outermost surface layer surface.

5. The semiconductor device according to claim 1 or 3 that is a vertical type MIS field-effect transistor having a gate insulation film, gate electrode and source on the outermost surface layer surface of the silicon carbide semiconductor region that, when a voltage is applied to the gate electrode, functions as a switching device that controls flow/interception of electric current flowing in the direction of the C axis perpendicular to the outermost surface layer surface.

6. The semiconductor device according to claim 1 or 3, wherein the silicon carbide semiconductor region is p type or n type.

7. The semiconductor device according to claim 1 or 3, wherein formation of the p type semiconductor region or n type semiconductor region by implantation of impurity ions in the silicon carbide semiconductor region is followed by implementation of impurity activation heat treatment for a period of 10 seconds to 10 minutes at a temperature of from 1500° C. to 2000° C. in an inert atmosphere.

8. The semiconductor device according to claim 1 or 3, wherein formation of the p type semiconductor region or n type semiconductor region by implantation of impurity ions in the silicon carbide semiconductor region is followed by elevation of a temperature from 1200° C. or below to from 1500° C. to 2000° C. within 1 minute, in an inert atmosphere, and implementation of impurity activation heat treatment for a period of 10 seconds to 10 minutes at that temperature.

9. The semiconductor device according to claim 1 or 3, wherein the silicon carbide semiconductor region on a substrate side is 4H—SiC.

10. An electric power converter constituted using the semiconductor device according to claim 1 or 3.

11. A drive inverter constituted using the semiconductor device according to claim 1 or 3.

12. A general-purpose inverter constituted using the semiconductor device according to claim 1 or 3.

* * * * *